United States Patent [19]
Hisai et al.

[11] Patent Number: 5,927,077
[45] Date of Patent: Jul. 27, 1999

[54] PROCESSING SYSTEM HOT PLATE CONSTRUCTION SUBSTRATE

[75] Inventors: Akihiro Hisai; Minobu Matsunaga; Hiroshi Kobayashi, all of Kyoto, Japan

[73] Assignee: Dainippon Screen Mfg. Co., Ltd., Japan

[21] Appl. No.: 08/839,264

[22] Filed: Apr. 17, 1997

[30] Foreign Application Priority Data

Apr. 23, 1996 [JP] Japan ..................................... 8-101491
May 15, 1996 [JP] Japan ..................................... 8-120348

[51] Int. Cl.⁶ ..................................................... F25B 21/02
[52] U.S. Cl. .............................. 62/3.3; 62/3.7; 219/444.1
[58] Field of Search ..................................... 219/390, 405, 219/411, 448, 449, 450, 451, 452; 392/416, 418; 156/345; 62/3.3, 3.7

[56] References Cited

U.S. PATENT DOCUMENTS

| | | | |
|---|---|---|---|
| 4,389,557 | 6/1983 | Devenyi et al. | 219/85 CM |
| 5,226,056 | 7/1993 | Kikuchi et al. | 373/18 |
| 5,411,076 | 5/1995 | Matsunaga et al. | 165/80.2 |
| 5,514,852 | 5/1996 | Takamori et al. | 219/388 |
| 5,638,687 | 6/1997 | Mizohata et al. | 62/62 |
| 5,702,624 | 12/1997 | Liao et al. | 219/497 |

*Primary Examiner*—Teresa Walberg
*Assistant Examiner*—Jiping Lu
*Attorney, Agent, or Firm*—Ostrolenk, Faber, Gerb & Soffen, LLP

[57] ABSTRACT

In a substrate thermal processing device, a temperature of a substrate can be precisely controlled within a short time by means of a hot plate oven. The substrate thermal processing device includes a substrate supporting plate for supporting the substrate, an auxiliary heating/cooling section for heating or cooling the substrate and having a Peltier effect element and disposed on a lower surface of the substrate supporting plate, and a main heating section for heating the substrate and disposed below the substrate supporting plate and the auxiliary heating/cooling section.

10 Claims, 16 Drawing Sheets

PROCESSING SYSTEM HOT PLATE CONSTRUCTION SUBSTRATE

BACKGROUND OF THE INVENTION

1. Field of the Invention

The present invention relates to a method for controlling the temperature of a substrate within a short period of time, a thermal processing device for heating or cooling a substrate, and a device for supporting a substrate.

2. Description of the Related Art

Devices which are used for processing substrates such as semiconductor wafers and glass substrates for liquid crystal displays often include a hot plate oven for heating the substrate, a chill plate for cooling the substrate, and a spinner for coating the surfaces of the substrate with a processing fluid or for cleaning the surfaces of the substrate.

The structure and temperature control process of a conventional hot plate oven will now be described.

The conventional hot plate oven used in these devices includes a substrate supporting plate for supporting the substrate, and a heat source such as a mica heater for heating the substrate supporting plate. The temperature of the substrate supporting plate is brought to a predetermined substrate processing temperature (for instance, 110° C.) by means of a controller. When a substrate at, for example, room temperature is mounted on the substrate supporting plate, the temperature of the substrate supporting plate is lowered rapidly. The substrate is then heated to the above-described substrate processing temperature by the heat source, and is thermally processed for a predetermined time period.

Here, the conventional mica heater only has a temperature increasing function. As a result, when the temperature of the substrate is brought up to the substrate processing temperature, the temperature of the substrate supporting plate is raised rapidly to a temperature close to the selected substrate processing temperature, and then is asymptotically increased until that temperature is reached.

This conventional temperature control method of bringing the substrate supporting plate up to the desired temperature takes a considerable amount of time. In addition, if the temperature of the substrate supporting plate exceeds the desired temperature, a considerable amount of time is required in order to lower this temperature to the desired level.

In addition, because the temperature increasing characteristics cannot be control precisely, the amount of time it takes the temperature to reach the desired level cannot be controlled. As a result, thermal progress cannot be controlled, and the substrate may be given an excessively large quantity or an excessively small quantity of heat.

SUMMARY OF THE INVENTION

An object of the present invention is to quickly and precisely control the temperature of a substrate.

Another object of the present invention is to controlled precisely the quantity of heat delivered to the substrate.

Yet another object of the present invention is to control precisely the temperature of the substrate by means of a simple structure.

A substrate thermal processing device according to one embodiment of the present invention includes a substrate supporting plate for supporting the substrate, an auxiliary heating/cooling section, and a main heating section. The auxiliary heating/cooling section includes a Peltier effect element and is arranged on a lower surface of the substrate supporting plate, and heats or cools the substrate supported by the substrate supporting plate. The main heating section is disposed below the auxiliary heating/cooling section, and heats the substrate supported by the substrate supporting plate.

Since this device includes an auxiliary heating/cooling section capable of heating and cooling the substrate in addition to the main heating section, after the substrate is heated rapidly by the main heating unit up to a temperature close to a predetermined temperature, the temperature of the substrate can be brought precisely to the predetermined temperature by using the auxiliary heating/cooling section to heat or cool the substrate. As a result, the temperature of the substrate supporting plate can be set correctly to a desirable temperature within a short period of time. Also, since the auxiliary heating/cooling section includes a Peltier effect element, the structure thereof can be made simple and compact in size.

The main heating section may further include an intermediate plate in contact with a lower surface of the auxiliary heating/cooling section, a heater section in contact with a lower surface of the intermediate plate, and a heat radiation section in contact with a lower surface of the heater section.

Here, heat emitted from the heater is transferred via the intermediate plate to the auxiliary heating/cooling section, and is further transferred to the substrate supporting plate. When the substrate is cooled by the auxiliary heating/cooling section, heat from the substrate supporting plate is absorbed by the Peltier effect element and is radiated outward via the intermediate plate, the heater section, and the heat radiation section. Heat is transferred uniformly by the intermediate plate, and also the heat radiation effect from the Peltier effect element can be increased.

Alternatively main heating section may include a heater plate into which a heater wire is embedded. The main heating section is in contact with the lower surface of the auxiliary heating/cooling section. Because the heater wire is embedded in the heater plate, the thickness of the device can be reduced.

A heat insulating material may also be disposed around at least the substrate supporting plate, with an air gap separating the heat insulating material from at least the substrate supporting plate. This makes it is possible to prevent the temperature of the outer peripheral portion of the substrate supporting plate from being lowered due to heat radiation. Thus, the uniform temperature characteristic within the surface of the substrate and the temperature increasing efficiency can be improved.

A heat radiation fin may be formed on the lower surface of the main heating section. This allows the heat radiation effects from the main heating section and the auxiliary heating/cooling section to be improved.

The auxiliary heating/cooling section may be subdivided into a plurality of regions, and the respective regions are capable of independently heating and cooling the substrate. For example, the auxiliary heating/cooling section may be subdivided into a center portion and a peripheral portion. Then the temperature of the peripheral portion is capable of being set higher than that of the center portion. Accordingly, the overall temperature distribution of the substrate supporting plate can be made uniform or be changed.

The present invention may also include a first temperature control section for controlling the heating/cooling operations of the auxiliary heating/cooling section, and a second temperature control section for controlling the heating operation of the main heating section. This allows the temperatures of the auxiliary heating/cooling section and of the main heating section to be controlled independently of each other.

According to another embodiment of the invention, a substrate temperature control method for controlling a temperature of a substrate at a predetermined temperature is disclosed. The substrate is supported on a substrate supporting plate having a heat exchanging device containing a Peltier effect element. The method includes a preparation step, a temperature-increasing step, and a temperature-controlling step. In the preparation step, the temperature of the substrate supporting plate is controlled at a predetermined temperature. In the temperature increasing step, a decision is made whether the temperature of the substrate supporting plate has decreased to a point lower than the predetermined temperature, and if so the temperature of the substrate supporting plate is increased. In the temperature controlling step, it is determined whether the temperature of the substrate supporting plate has again reached the predetermined temperature. If so, temperature control by the heat exchanging device is performed so that the temperature of the substrate supporting plate is maintained at the predetermined temperature.

According to this method, the temperature of the substrate supporting plate is first controlled at the predetermined temperature. Then, when the substrate at, for example, room temperature is placed on the substrate supporting plate, the temperature of the substrate supporting plate is lowered and is detected by a sensor. Next, when the temperature of the substrate supporting plate is brought back to the predetermined temperature, the temperature of the substrate supporting plate is maintained at the predetermined temperature while being heated and/or cooled by the heat exchanging device employing the Peltier effect element.

In the temperature controlling step, because the temperature of the substrate supporting plate is controlled by the heating/cooling operations of the heat exchanging device, the time it takes to reach the predetermined temperature can be shortened and precise temperature control can be achieved. In addition, because the heat exchanging device includes a Peltier effect element, the entire arrangement can be made simple in comparison with heat exchanging devices that use water cooling.

In the temperature increasing step, a maximum allowable amount of energy is supplied to the substrate supporting plate to thereby increase the temperature. In this step, the temperature of the substrate supporting plate is increased by using the maximum allowable amount of electrical power when the temperature is lowered below the predetermined temperature. Accordingly, the temperature of the substrate supporting plate can reach the predetermined temperature in less time. In a conventional heater, if the temperature is increased by using the maximum allowable amount of power, the temperature may exceed the predetermined temperature. Thus, it is necessary to wait for the temperature to decrease to the predetermined temperature. However, according to the present invention, because the heat exchanging device with a Peltier effect element is employed, even when the temperature is increased by using maximum power, the temperature of the substrate supporting plate can be controlled readily at the predetermined temperature within a short period of time.

The temperature controlling step determines whether the temperature of the substrate supporting plate has reached the predetermined temperature and, if it is, commences the temperature controlling operation.

According to yet another embodiment of the invention, a substrate temperature control method for controlling a temperature of a substrate to a desirable predetermined temperature includes a preheat step, a temperature decreasing step, and a temperature controlling step. The substrate is supported on a substrate supporting plate having a heat exchanging device containing a Peltier effect element. In the preheat step, before the substrate is mounted on a supporting plate, the temperature of the substrate supporting plate is set to an temperature exceeding the predetermined temperature before the substrate thereon. In the temperature decreasing step, after the substrate is mounted on the substrate supporting plate and a predetermined time has elapsed, the temperature of the substrate supporting plate is lowered to the predetermined temperature. In the temperature controlling step, it is determined whether the temperature of the substrate supporting plate has reached the predetermined temperature during the temperature decreasing step, and if so the temperature of the substrate supporting plate is controlled by the heat exchanging device.

In this method, before the substrate is mounted on a supporting plate, the temperature of substrate supporting plate is set to a temperature higher than the predetermined temperature before the mounted substrate is mounted. Then, after the substrate is mounted on the substrate supporting plate and a predetermined amount of time has elapsed, the temperature of the substrate supporting plate is decreased to the predetermined temperature. Subsequently, the substrate supporting plate is heated and/or cooled by the heat exchanging device, so that the temperature thereof can be maintained at the predetermined temperature.

Because the temperature of the substrate supporting plate is previously set to a temperature higher than the predetermined temperature, even when a substrate at room temperature is mounted on the substrate supporting plate and lowers the temperature thereof, the time period required to bring the substrate supporting plate up to the predetermined temperature can be shortened.

The temperature controlling step may also control the temperature of the substrate supporting plate at the predetermined temperature by means of a proportional-integral-derivative (PID) control system.

According to yet another aspect of the invention, a substrate processing device for heating/cooling a substrate includes a substrate supporting plate for supporting the substrate, a heat exchanging device including a Peltier effect element for heating and cooling the substrate supporting plate, a temperature detecting device for detecting temperature of the substrate supporting plate, a time measuring device for measuring the amount of time the substrate is mounted on the substrate supporting plate, and a control device for controlling the heat exchanging device in response to data from the temperature detecting device and the time measuring device so as to control a total amount of heat given to the substrate.

The temperature control is carried out by the heat exchanging device having a Peltier effect element, and the total amount of heat given to the substrate is controlled based on the temperature and time data from the substrate supporting plate. As a consequence, the thermal progress of the substrate can be determined and be controlled.

The control device controls the heat exchanging device such that the temperature of the substrate supporting plate exceeds a first temperature to become a predetermined temperature, that is maintained for a predetermined time, and the temperature of the substrate supporting plate is then lowered from the predetermined temperature to below a second temperature. The control device also controls the thermal progress between the time the temperature of the substrate supporting plate exceeds the first temperature and falls below the second temperature.

According to yet another embodiment of the invention, a substrate processing device for heating/cooling a substrate includes a substrate supporting plate for supporting the substrate, a heat exchanging device including a Peltier effect element for heating and cooling the substrate supporting plate, a temperature detecting device for detecting temperature of the substrate supporting plate, a substrate detecting device for detecting whether the substrate is mounted on the substrate supporting plate, and a control device. The control device controls the heat exchanging device such that before the substrate is mounted on the substrate supporting plate, the temperature of the substrate supporting plate is brought to a temperature that is below a predetermined temperature, and after the substrate is mounted on the substrate supporting plate, the temperature of the substrate supporting plate is brought to the predetermined temperature.

In this device, because the heat exchanging device including the Peltier effect element is employed, the temperature increasing characteristics can be readily controlled with a relatively degree of precision.

According to a yet another embodiment of the invention, a substrate supporting device includes a substrate supporting plate for supporting a substrate, and a Peltier effect element and a heat source, which are arranged on a lower surface of the substrate supporting plate in parallel with each other. In this device, since the Peltier effect element is arranged in parallel with the heat source, such as the mica heater, the vertical dimension of the device can be reduced.

Other objects, features, aspects and advantages of the present invention will be apparent from the following detailed description of the present invention when taken in conjunction with the accompanying drawings, in which like reference numerals designate the same or similar parts throughout.

DETAILED DESCRIPTION OF THE PREFERRED EMBODIMENTS

A. Substrate Processing Device

Figure 1:
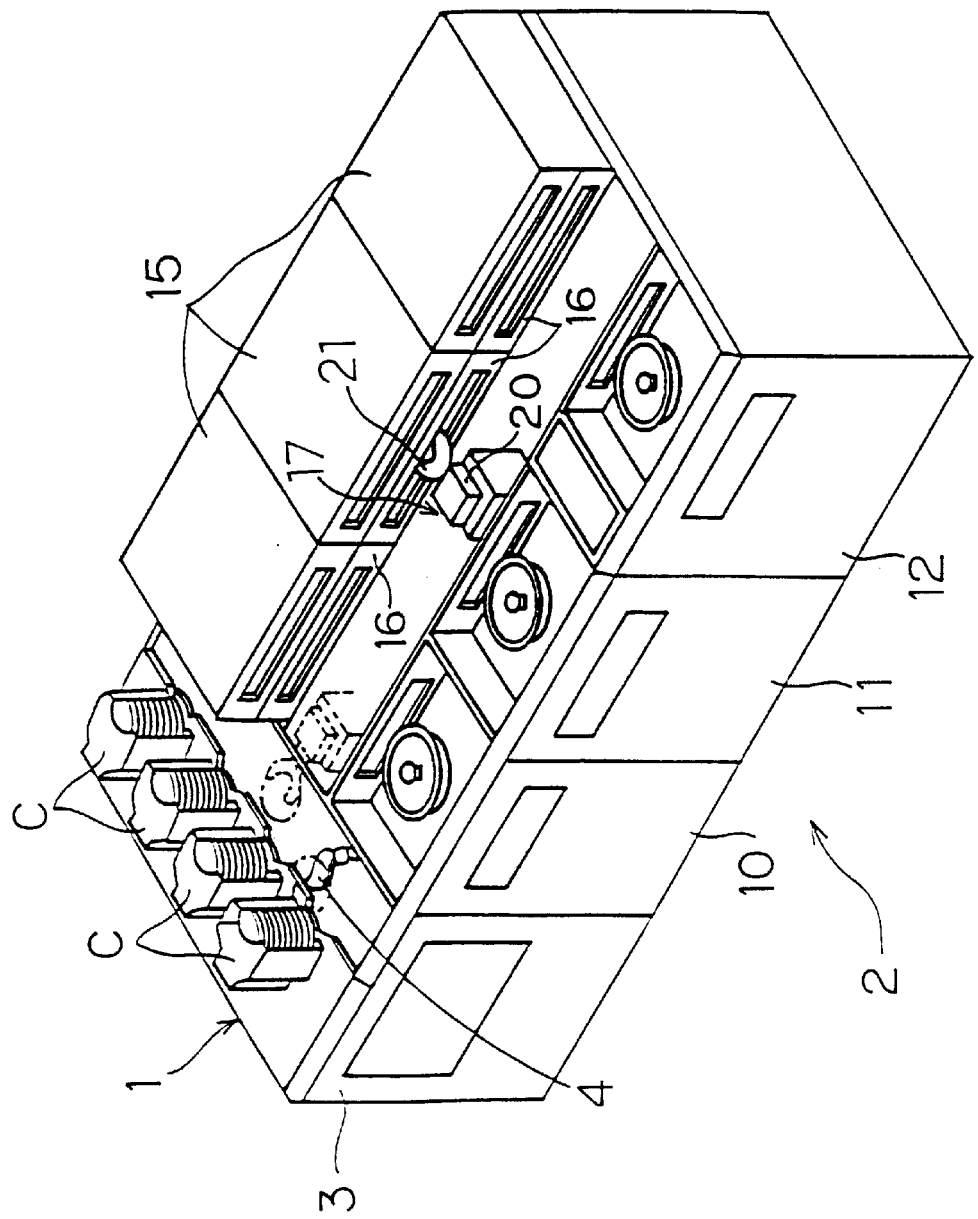
FIG. 1 is a perspective view of the overall structure of a substrate processing device according to one embodiment of the present invention.

Now referring to FIG. 1 wherein the overall structure of a substrate processing device according to one embodiment of the present invention is illustrated. This substrate processing device performs a variety of processes on semiconductor wafers (hereinafter referred to as "substrates"), such as coating, developing, heating, and cooling. The substrate processing device of FIG. 1 includes an indexer section 1 for storing unprocessed and processed substrates, and a substrate processing section 2 for executing the above-mentioned process operations.

The indexer section 1 contains four cassettes C in one array mounted on a upper surface of a base 3, and a transport/mount robot 4 which moves along the array of the cassettes C. The cassettes C include multiple slots capable of receiving the substrates, and the transport/mount robot 4 moves the substrates from the cassettes C to the substrate processing section 2 and vice versa.

The substrate processing section 2 includes a spin coater 10 arranged next to the cassettes c, two spin developers 11 and 12 for the developing process operation, a chill plate 15, and a hot plate oven 16. The chill plates 15 and the hot plate ovens 16 are opposed to the spin coater 10 and the two spin developers 11 and 12. A transport robot 17 is provided between the spin coater 10 and the spin developers 11, 12, and the chill plate 15 and the hot plate oven 16 and is capable of moving between them.

The spin coater 10 serves to place a photoresist fluid and the like on a surface of the substrates, and the spin developers 11 and 12 serve to develop the substrates. The chill plate 15 and the hot plate oven 16 are disposed next to each other, and serve to cool and heat the substrates respectively. It should be noted that the hot plate oven 16 also has a cooling function (to be described below).

The transport robot 17 includes a transport base 20 transportable along both horizontal and vertical axis, and an arm 21 capable of supporting a substrate. The arm 21 can be moved forward and backward with respect to the transport base 20. The forward and backward movement of the arm 21 can be realized along any direction, since the transport base 20 is rotated within the horizontal plane. The transport robot 17 allows each substrate to be passed and received between the spin coater 10 and the spin developers 11, 12, and between the chill plate 15 and the hot plate oven 16, as well as between the transport/mount robot 4 of the indexer section 1.

Although omitted from FIG. 1, the substrate processing device 2 also includes an interface section for passing and receiving substrates to and from another substrate processing device (such as an exposing device).

B. Hot Plate Oven

Figure 2:
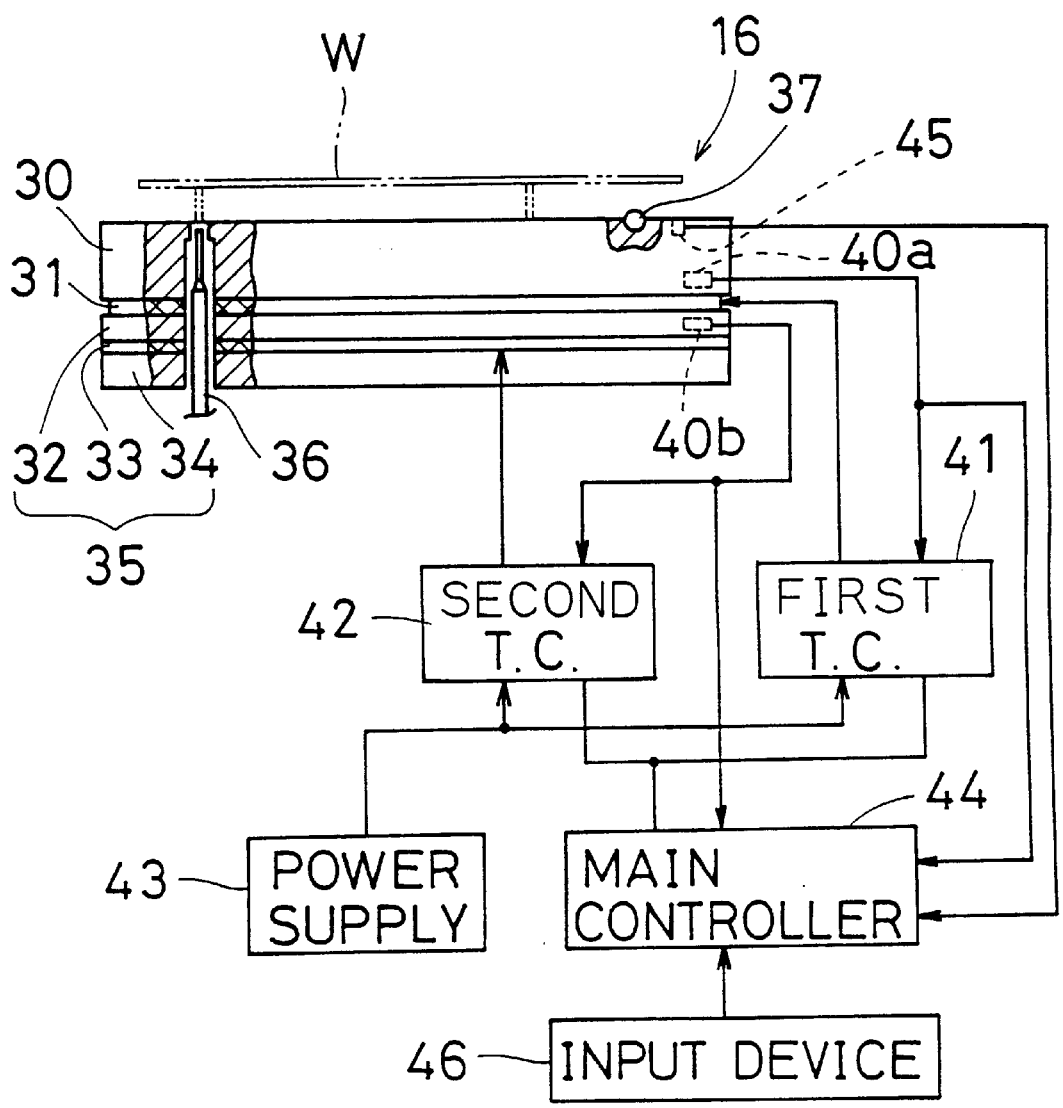
FIG. 2 is a diagram of a hot plate oven section employed in the substrate processing device of FIG. 1.

Next, the structure of the hot plate oven 16 will now be explained with reference to FIG. 2.

The hot plate oven 16 includes a substrate supporting plate 30 which supports a substrate w on an upper portion thereof, and an auxiliary heating/cooling section 31 disposed on a lower surface of the substrate supporting plate 30. The auxiliary heating/cooling section 31 functions as a heat exchanger and includes a Peltier effect Element. Beneath the auxiliary heating/cooling section 31 are an intermediate plate 32 disposed to be in contact with the auxiliary heating/cooling section 31; a heater section 33 disposed to be in contact with a lower surface of the intermediate plate 32, and a heat rediation plate disposed to be in contact with the lower surface of the heater section 33. The intermediate plate 32, the heater section 33 and the heat radiation plate 34 constitute a main heating section 35.

The auxiliary heating/cooling section 31 can heat and cool the substrate W via the substrate supporting plate 30 by switching the direction of electric current flow with respect to the Peltier effect element. The heater section 33 is a mica heater, and may heat the substrate W supported by the substrate supporting plate 30 at a high speed and over a wide temperature range.

The hot plate oven 16 also includes a lift pin 36, which penetrates through the substrate supporting plate 30, the auxiliary heating/cooling section 31, the intermediate plate 32, the heater section 33, and the heat radiation plate 34. The lift pin 36 can be elevated by a drive source (not shown), and moves the substrate W to and from the arm 21 of the transport robot 17. In addition, a plurality of balls 37 are disposed in the substrate supporting plate 30. A portion of each of the balls 37 project from the surface of the substrate supporting plate 30, and support the substrate W. The balls 37 prevent the substrate W from contacting the substrate supporting plate 30 thereby preventing the lower surface of substrate W; from being contaminated.

The substrate supporting plate 30 further includes a first temperature detecting sensor 40a, which is connected to a first temperature controller (TC) 41. A second temperature detecting sensor 40b is disposed on the intermediate plate 32, and is connected to a second temperature controller 42. The first and second temperature controllers 41 and 42 control the electrical current flowing from a power supply 43 to the auxiliary heating/cooling section 31 and the heater section 33.

The main controller 44 controls the first and second temperature controllers 41 and 42, and is equipped with a microcomputer containing a CPU, a RAM, a ROM, a clock, and the like. A substrate detecting sensor 45 is disposed on the substrate supporting plate 30 and connected to the main controller 44, and serves to detect whether the substrate W is mounted on substrate supporting plate 30. An input section 46, such as a keyboard, is also connected to the main controller 44.

C. Operation of the Substrate Processing Device

As shown in FIG. 1, when the cassettes C are transported to the indexer section 1, the substrates stored therein are passed to the transport robot 17 by the robot arm 4. The transport robot 17 transports each substrate to the spin coater 10, the spin developers 11, 12, the chill plate 15, and the hot plate oven 16 in accordance with a preprogrammed transportation sequence. While executing this process operation, the transport robot 17 transfers or receives each substrate to or from another exposing device via an interface section (not shown). Each processed substrate is then passed to the robot arm 4 of the indexer section 1 by the transport robot 17, and then is stored into the cassette C.

During the above-described process operations, the following temperature control operations are carried out in the hot plate oven 16.

D. Normal Temperature Increase Control Operation

Figure 3:
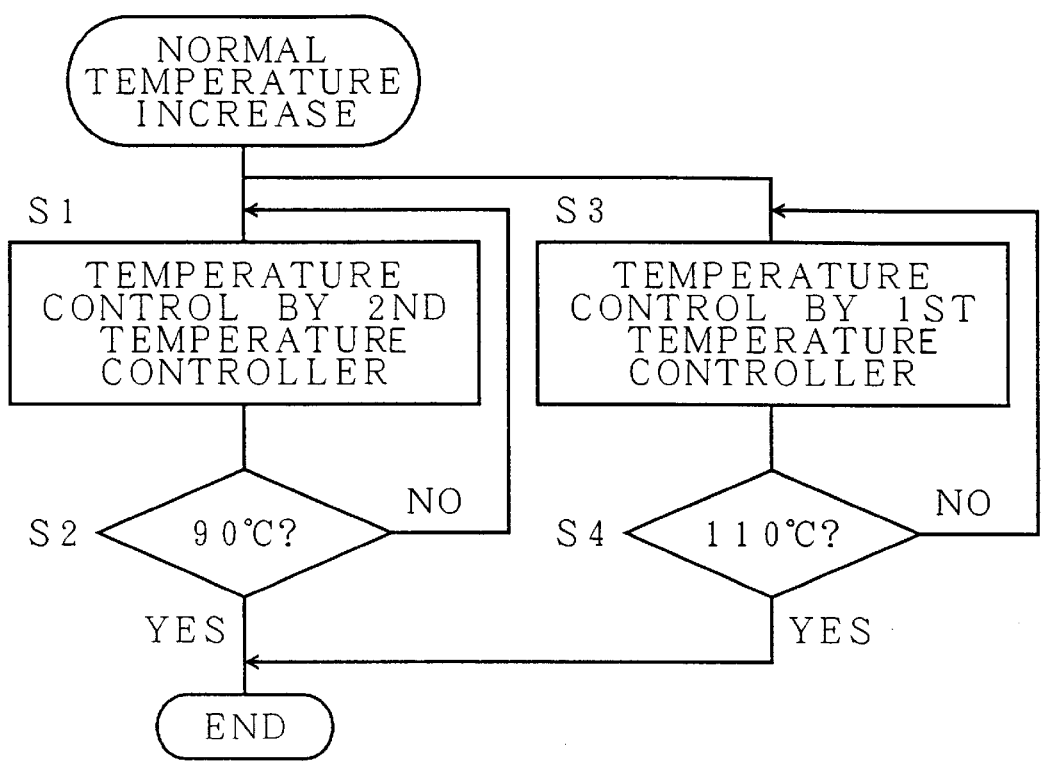
FIG. 3 is a flow chart describing a normal temperature increasing control operation executed by the substrate processing device shown in FIG. 1.

When the temperature of the hot plate oven 16 is increased to a target temperature (for example, 110° C.), a control process operation is executed by the main controller 44, as shown in the flow chart of FIG. 3. At step S1, a temperature control operation is executed by the second temperature controller (TC) 42. At step S1, an electric current is supplied from the power supply 43 to the heater section 33 to heat the substrate supporting plate 30. At step S2, it is determined whether or not the temperature of the intermediate plate 32 has reached 90° C., via the sensor output from the temperature detecting sensor 40b.

Another temperature control operation is carried out at step S3 by the first temperature controller (TC) 41 in parallel with the above-described steps S1 and S2. Here, an electric current is supplied from the power supply 43 to the auxiliary heating/cooling section 31 to heat the substrate supporting plate 30. Then, at step S4, it is determined whether or not the temperature of the hot plate oven 16 has reached 110° C., via the sensor output from the temperature detecting sensor 40a. More specifically, the electric current is supplied to the auxiliary heating/cooling section 31 by the first temperature controller 41 in such a manner that the hot plate oven 16 is heated or cooled (by means of the Peltier effect), in order that the temperature of the hot plate oven reaches the target temperature of 110° C.

Since the temperature control operations are carried out by means of the heater section 33 and the auxiliary heating/cooling section 31, the auxiliary heating/cooling section 31 can be made simpler, as compared with a control process operation entirely executed by the auxiliary heating/cooling section 31 alone. Moreover, the temperature control operation of this embodiment can be carried out precisely and within a short time, as compared with a temperature control operation performed entirely by the heater section 33 alone.

E. High Speed Temperature Increase Control Operation (1)

When the temperature of the hot plate oven 16 is controlled by the normal temperature increasing control process operation, the temperature of the hot plate oven 16 is lowered rapidly when the substrate W is mounted thereon. As a result, a first high speed temperature increasing control operation is carried out in order to set the lowered temperature of the hot plate oven 16 to the desired temperature.

Figure 4:
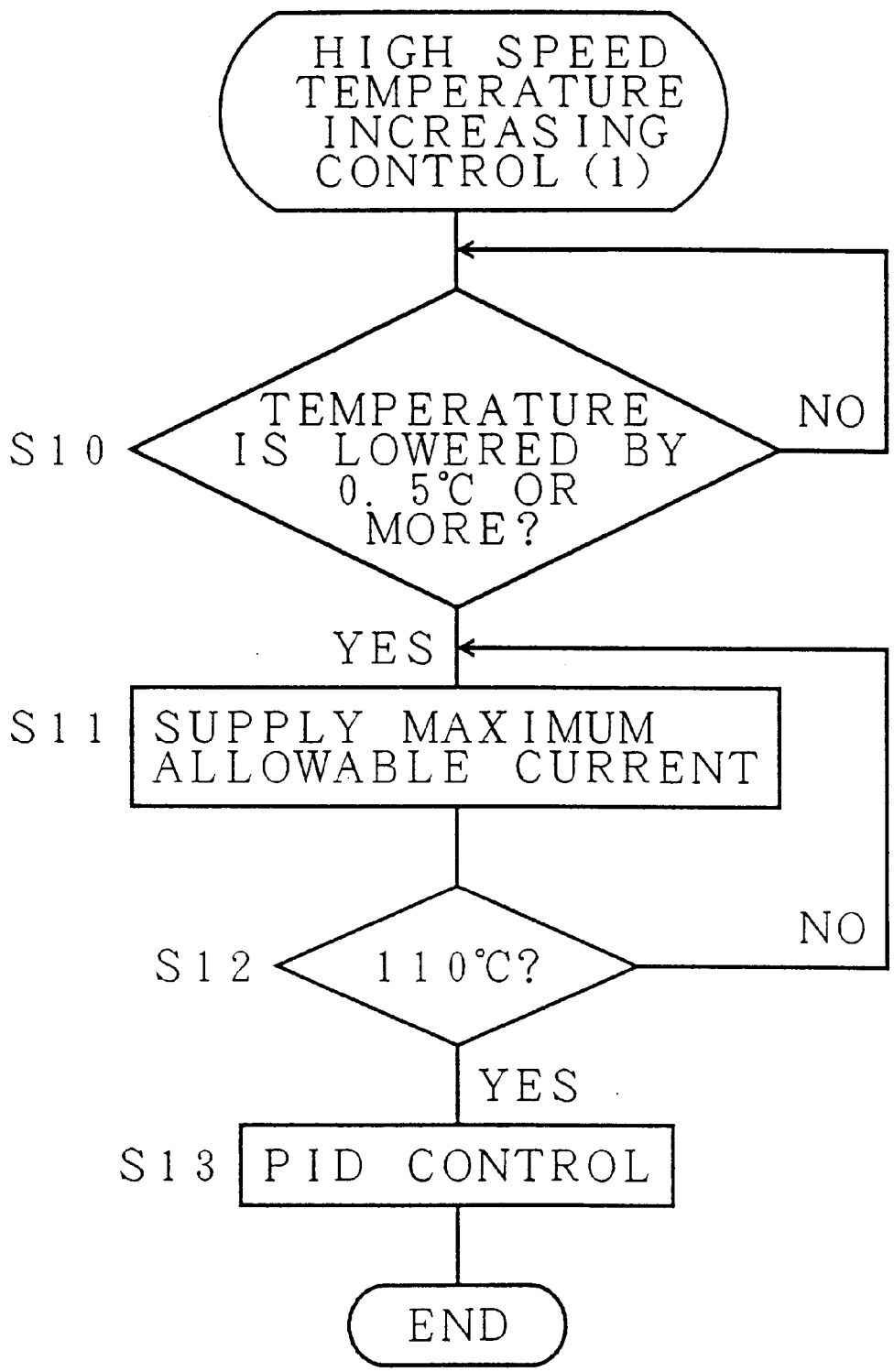
FIG. 4 is a flow chart describing a high speed temperature increasing control operation (1) executed by the substrate processing device shown in FIG. 1.

A first high speed temperature increasing control process will now be explained with reference to the flow chart shown in FIG. 4.

Figure 6:
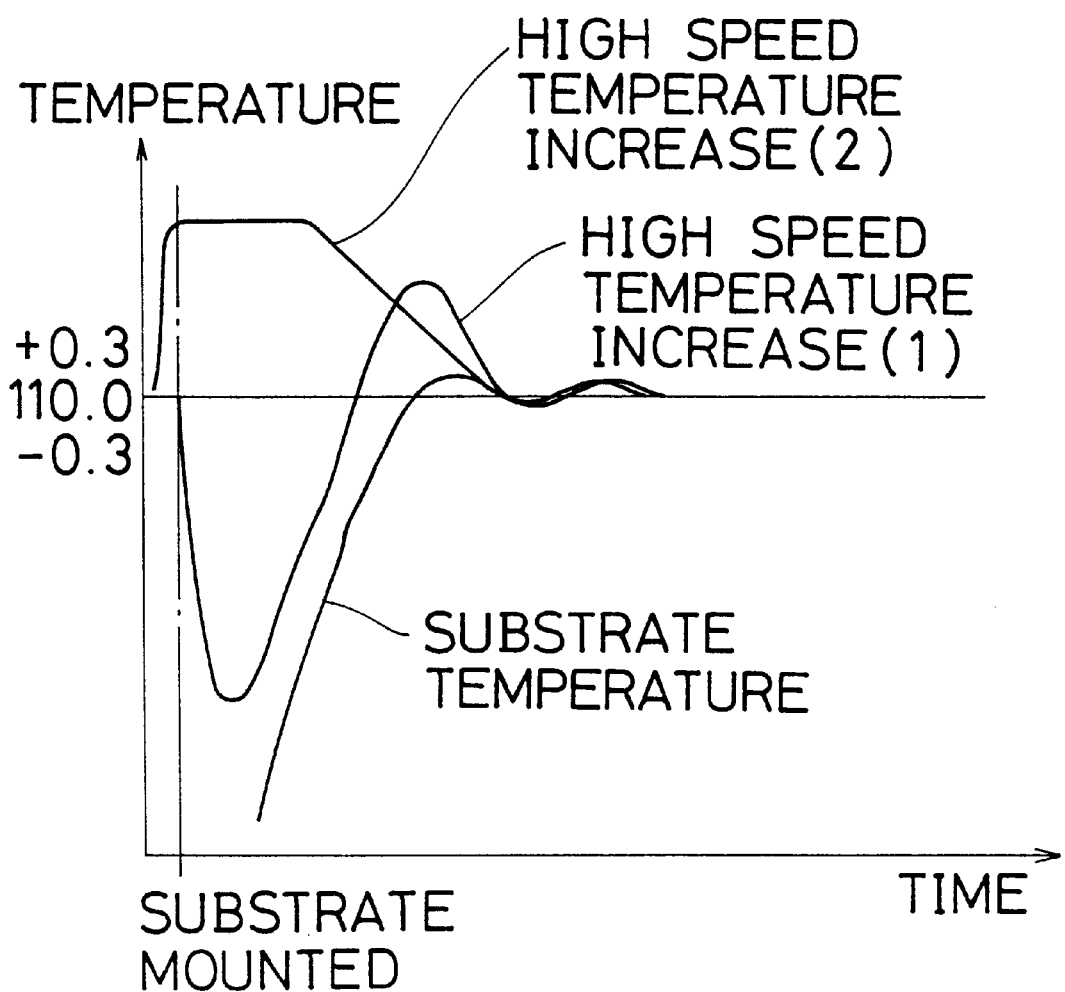
FIG. 6 is a diagram showing the temperature increasing characteristics of the high speed temperature increasing control operations (1) and (2)

When a substrate W at room temperature (approximately 23° C.) is mounted on a substrate supporting plate 30 maintained at 110° C., the temperature of the hot plate oven 16 is rapidly lowered (as shown in FIG. 6). Therefore, at step S10 it is determined whether or not the temperature of the hot plate oven 16 has been decreased 0.5° C. or more by checking the sensor output from the temperature detecting sensor 40a. If a temperature decrease of 0.5° C. or more is detected, the process operation is advanced from step S10 to step S11. At step S11, the first temperature controller 41 sends the maximum allowable electric current to the auxiliary heating/cooling section 31. As a result, the temperature of the hot plate oven 16 is increased by the maximum operation.

At step S12, another check is made to determine whether the temperature of the hot plate oven 16 has reached 110° C. If not, the temperature increasing operation is continued at full power until the temperature of the hot plate oven 16 reaches 110° C. When the temperature reaches 110° C., the high speed temperature increasing operation is advanced to step S13. At step S13, the first temperature controller 41 is switched to a PID (proportional-integral-derivative) control mode, which slows the temperature increasing operation. The temperature of the hot plate oven 16 is then brought to 110° C.±0.3° C.

When the next substrate W is mounted, a temperature decrease of 0.5° C. or greater will be sensed and the high speed temperature increasing process operation will be returned to step S10 and repeated.

Because the auxiliary heating/cooling section 31 includes a Peltier effect element, even if the temperature of the substrate overshoots the desired temperature, the substrate can be quickly cooled to bring its temperature back to the desired level. This allows the temperature of the substrate to be controlled precisely to a preset temperature within a short period of time.

F. High Speed Temperature Increase Control Operation (2)

Figure 5:
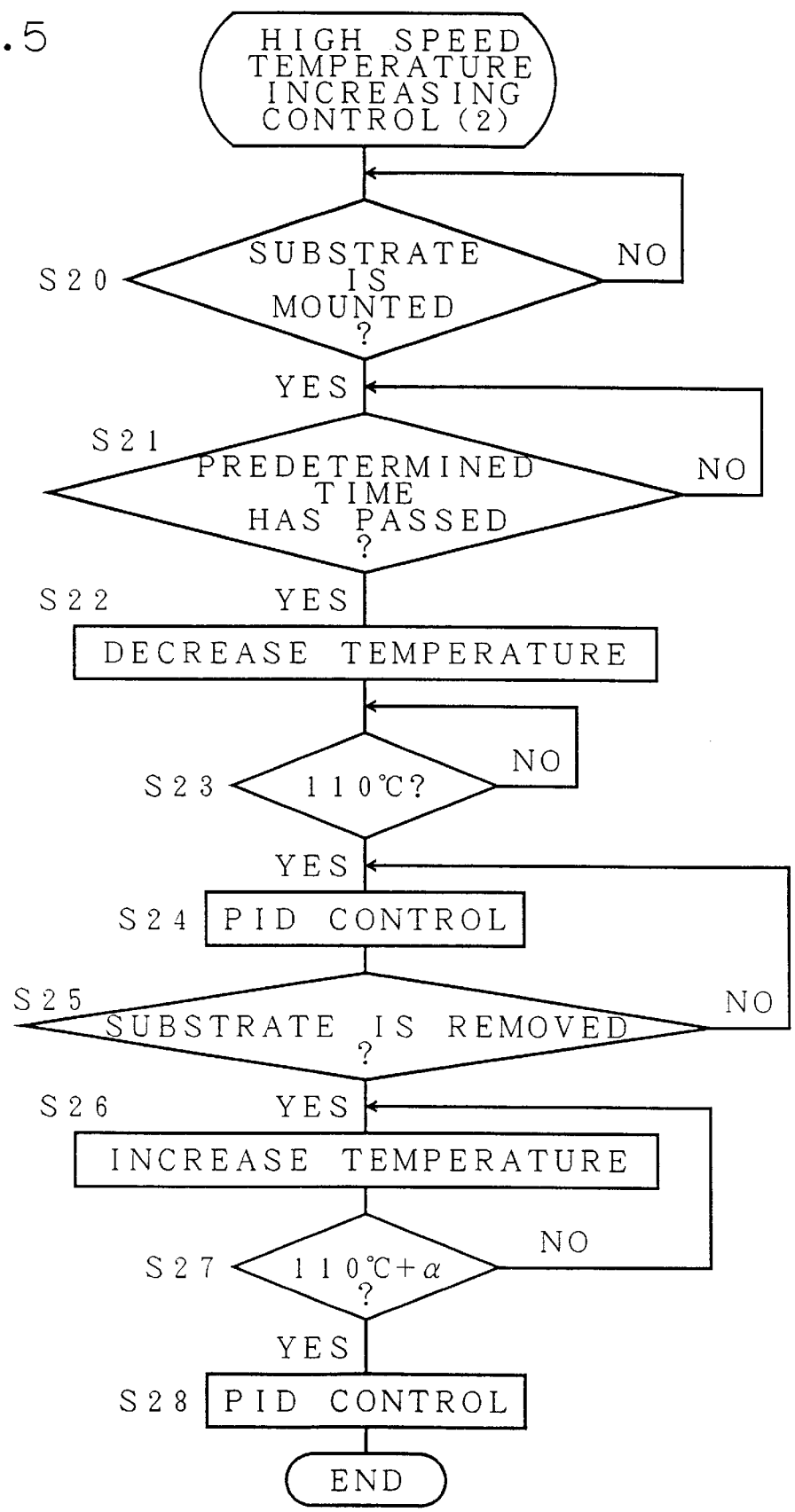
FIG. 5 is a flow chart describing a high speed temperature increasing control operation (2) executed by the substrate processing device shown in FIG. 1.

A second high speed temperature increasing control operation is shown in the flow chart of FIG. 5.

In this example, the temperature of the hot plate oven 16 is set to a temperature slightly higher than the target temperature of 110° C. in the normal temperature increasing control.

Then, at step S20 it is determined whether or not the substrate W is mounted on the hot plate oven 16, by reading the output of the substrate detecting sensor 45. If the substrate W is detected, the control operation is advanced to step S21. At step S21, it is determined whether or not a predetermined time period (for instance, 15 seconds) has elapsed since the substrate W was mounted. When the predetermined time period has elapsed, the control operation is advanced to step S22, where the first temperature controller 41 lowers the temperature of the substrate W by means of the auxiliary heating/cooling section 31. The temperature decreasing operation is carried out by supplying an electric current to the Peltier effect element opposite to that supplied when the first temperature increasing operation was carried out.

At step S23, it is determined whether or not the temperature of the hot plate oven 16 has been decreased to the target temperature of 110° C. If the temperature has decreased to the target temperature of 110° C., then the control operation is advanced to step S24. At step S24, control is switched to the PID control so that the temperature of the hot plate oven 16 is maintained at 110° C.

At step S25, it is determined whether or not the substrate W has been removed from the hot plate oven 16. If the substrate W has been removed, the control operation is advanced to step S26. At step S26, either the first temperature controller 41 or the second temperature controller 42 is used to increase the temperature of the hot plate oven 16. At step S27, it is determined whether or not the temperature of the hot plate oven 16 has been raised above 110° C. If this has occurred, the control operation is advanced to step S28. At step S28, the PID control maintains the temperature at the desired level above 110° C.

When the next substrate is mounted, the control process operation returns to step S20 and is repeated.

Similar to the previous temperature control operation, because the cooling operation is performed by the auxiliary heating/cooling section 31 to achieve precise temperature control within a short period of time, the temperature of the hot plate oven 16 can be preset to a temperature higher than the desired temperature. As a result, the temperature decreasing effect caused by mounting the substrate W can be reduced, and the temperature of the substrate W can be brought to the desired temperature within a short period of time.

G. Thermal Progress Control (1)

The hot plate oven 16 can also be used as a means to thermally treat a photoresist on a substrate, or evaporate the solvent in a photoresist coated on the substrate. To achieve this purpose, the total thermal energy (total amount of heat) provided to the substrate W must be carefully controlled.

Figure 7:
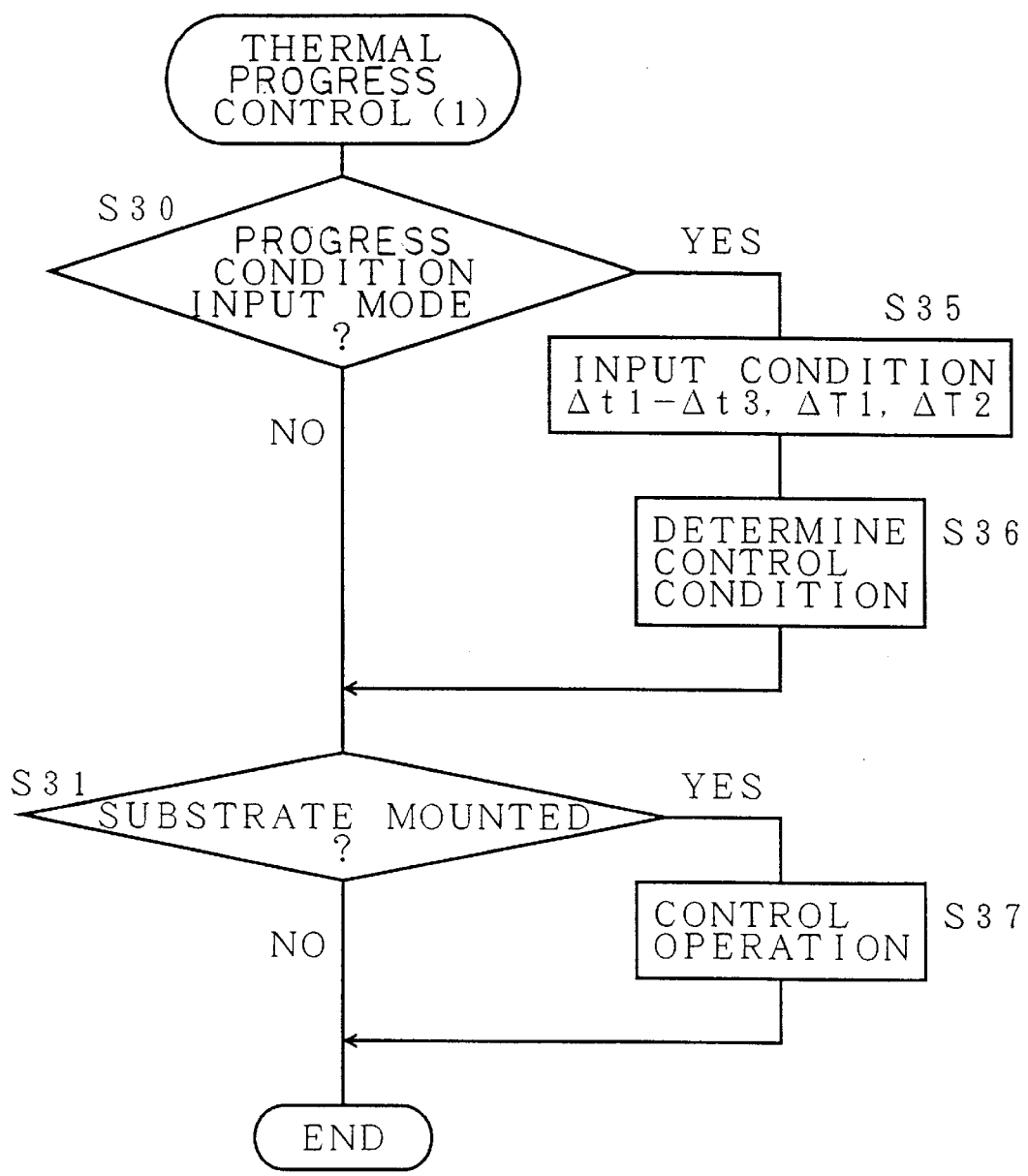
FIG. 7 is a flow chart describing a thermal progress control operation (1) executed in the substrate processing device of FIG. 1.
Figure 8:
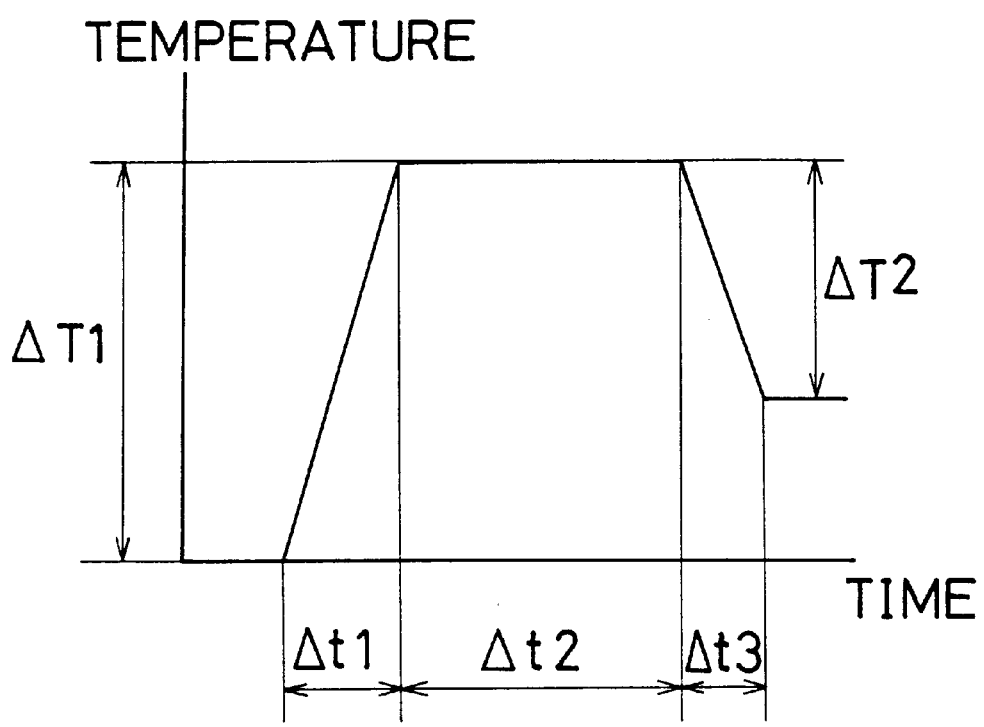
FIG. 8 is a diagram showing the characteristics of the thermal progress control operation (1)

In this case, control process operations are executed by the main controller 44, and are shown in a flow chart in FIG. 7 and in a graph in FIG. 8. In the flow chart of FIG. 7, at step S30 it is determined whether or not the present mode is set to a thermal progress input mode, and at step S31 it is determined whether or not the substrate W is mounted on the hot plate oven 16.

When the thermal progress condition is entered, the mode is switched to a condition input mode. Here, the thermal progress control operation is advanced from step S30 to step S35. At step S35, information relating to time parameters $\Delta t1$, $\Delta t2$, and $\Delta t3$, and temperature parameters $\Delta T1$ and $\Delta T2$ (as shown in FIG. 8) are accepted. These parameters are entered by an operator through the input section 46. At step S36, temperature control is determined in accordance with the temperature parameters entered at step S35. More specifically, the first temperature controller 41 sets the level of electric current to be supplied to the auxiliary heating/cooling section 31.

When the substrate W is mounted on the hot plate oven 16, the thermal progress control operation is advanced from step S31 to step S37. In accordance with the control condition determined at step S36, the electric current supplied to the auxiliary heating/cooling section 31 is controlled by the first temperature controller 41, and thus the temperature is controlled in the manner shown in FIG. 8.

H. Thermal Progress Control (2)

The thermal reaction of the photoresist coated on the substrate w abruptly begins when the temperature of the substrate W is increased above a certain temperature T1, and is abruptly inhibited when the substrate temperature falls below a certain temperature T2. Thus, the thermal progress of the substrate W must be controlled carefully.

Figure 9:
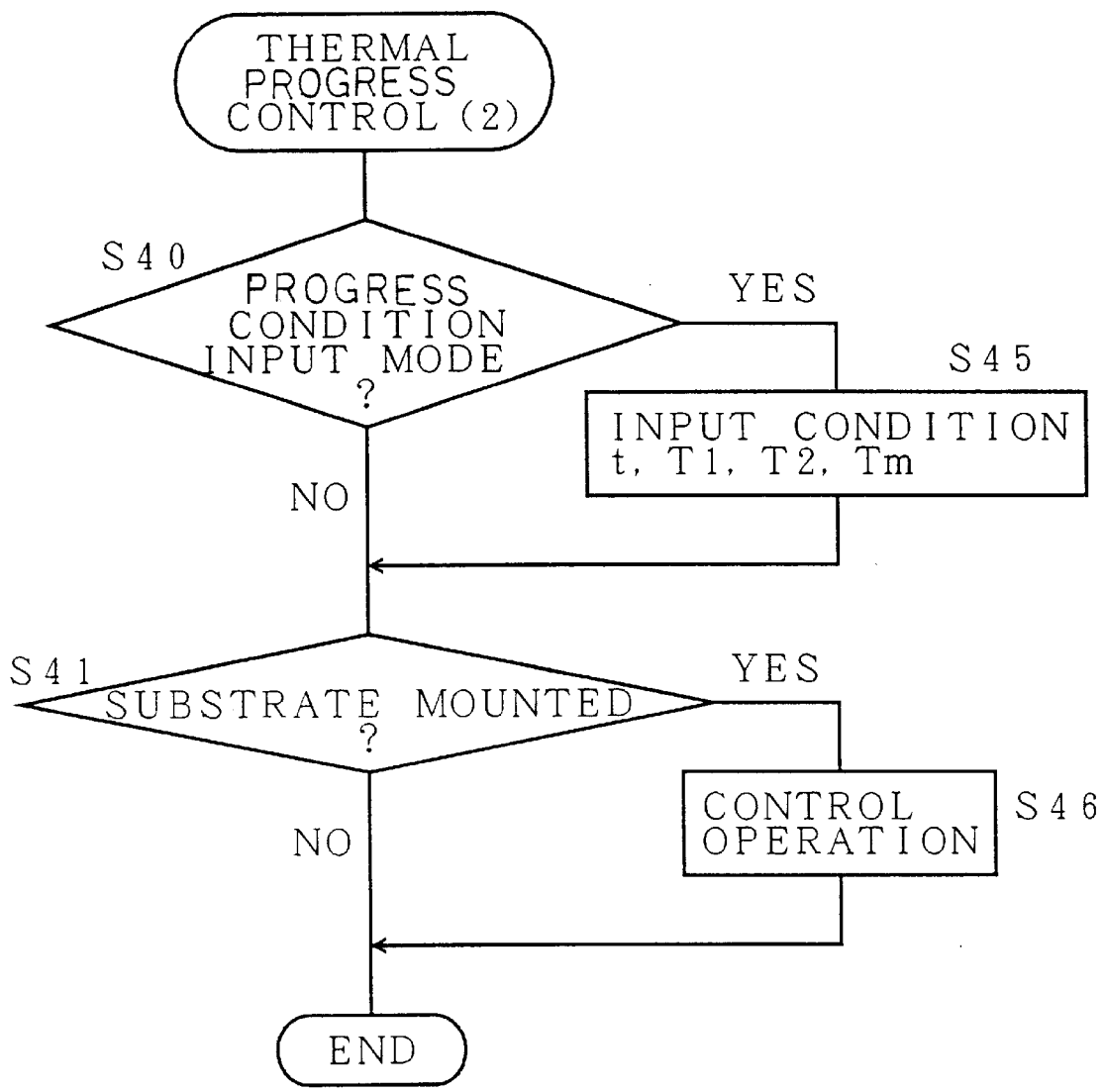
FIG. 9 is a flow chart describing a thermal progress control operation (2) executed in the substrate processing device of FIG. 1.
Figure 10:
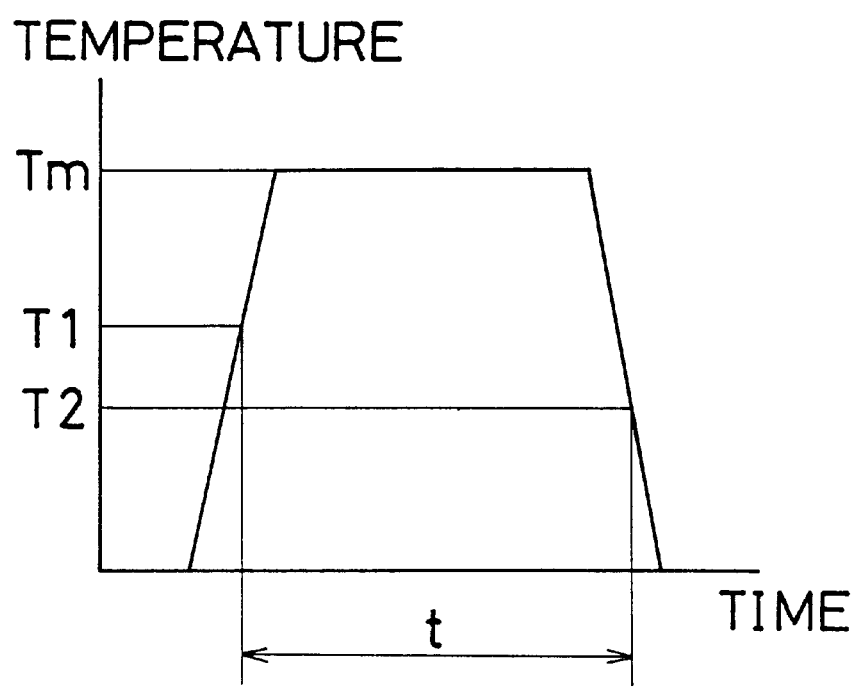
FIG. 10 is a diagram showing the characteristics of the thermal progress control operation (2)

FIG. 9 and FIG. 10 show the thermal progress control carried out by the main controller 44.

At step S40 of the flow chart shown in FIG. 9, it is determined whether or not a thermal progress input mode has been set, and at step S41 it is determined whether or not the substrate W is mounted on the hot plate oven 16.

When the thermal progress condition is entered, the mode is switched to the condition input mode. Here, the thermal progress control operation is advanced from step S40 to step S45. At step S45, time parameter "t" and temperature parameters T1, T2, and Tm (shown in FIG. 10) are accepted.

If the substrate W is mounted on the hot plate oven 16, the thermal progress control operation is advanced from step S41 to step S46. At step S46, an electric current controlled by the first temperature controller 41 is supplied to the auxiliary heating/cooling section 31 in accordance with the parameters set at step S45. Thus, temperature control is carried out so as to achieve the temperature characteristic curve shown in FIG. 10.

I. Stepped Baking Control

Figure 11:
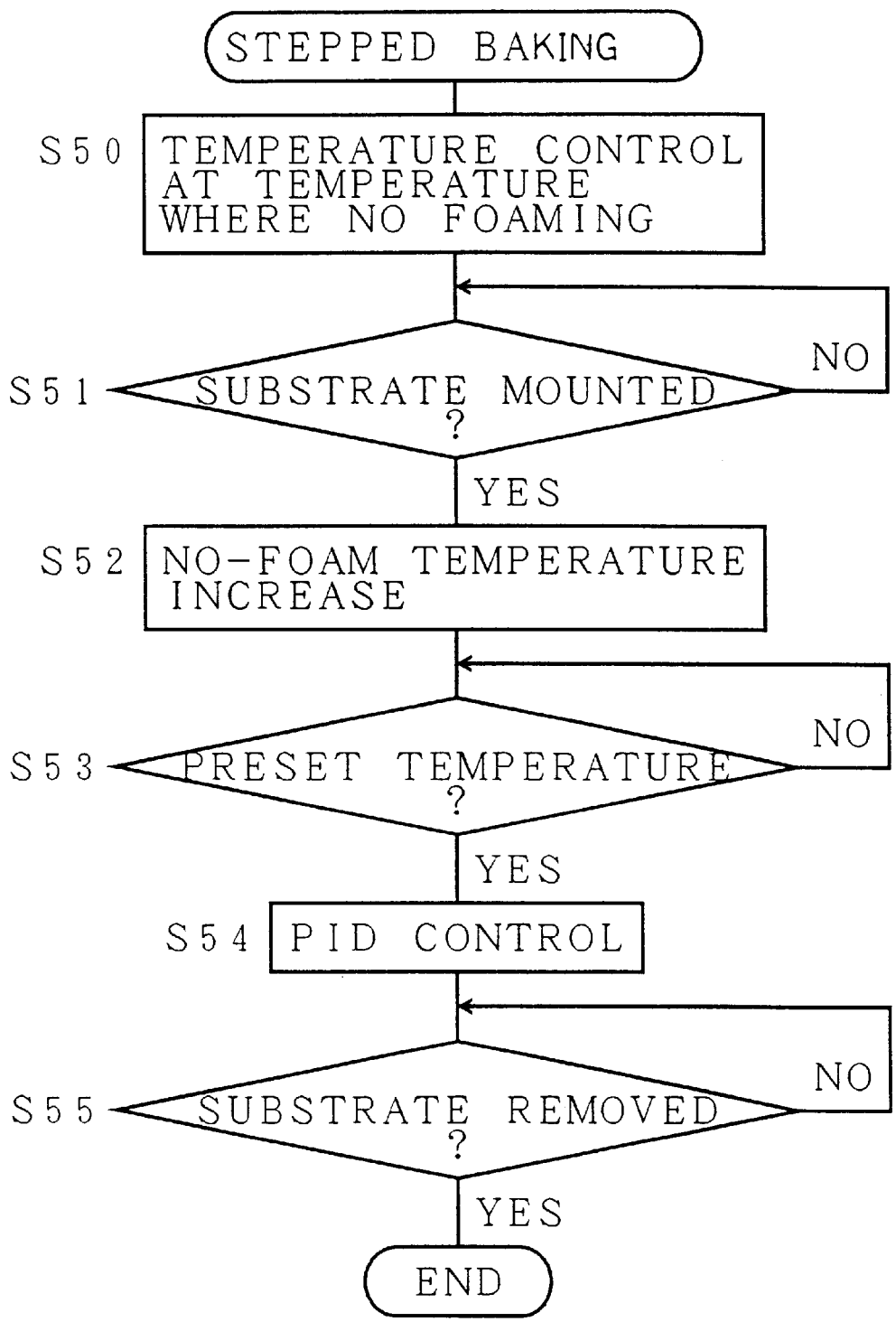
FIG. 11 is a flow chart describing a stepped baking control operation executed in the substrate processing device of FIG. 1.

When a substrate W has been coated with SOG or a semi-dried resist, and is mounted on a hot plate oven 16 whose temperature is maintained at a desirable level, there is a possibility that the SOG and the resist coated on the substrate W will foam. To prevent foaming, a stepped baking control operation as shown in the flow chart of FIG. 11, is executed by the main controller 44.

At step S50, the temperature of the hot plate oven 16 is heated to a temperature at which the resist coated on the substrate W will not foam. At step S51, it is determined whether or not the substrate W is mounted on the hot plate oven 16. If the substrate W is mounted, the stepped baking control operation is advanced to step S52. At step S52, the first temperature controller 41 increases the temperature of the hot plate oven 16 such that the processing fluid on the substrate W does not foam.

At step S53, it is determined whether or not the temperature of the hot plate oven 16 has reached a preset temperature. If the temperature has reached the preset temperature, the control operation is advanced to step S54, at which the first temperature controller 41 executes the PID control. At step S55, it is determined whether or not the substrate W has been removed from the hot plate oven 16. If the substrate W has been removed from the hot plate oven 16, the stepped baking control operation is accomplished and the control operation is returned to step S50 to await the next substrate W.

Because the above-described stepped baking control operation of this embodiment can be executed by a single hot plate oven, the conventional two-stage process is not necessary. In the conventional two-stage process, the substrate is processed on a hot plate oven whose temperature is set at a level in which the processing fluid does not foam, and then is processed on another hot plate oven whose temperature is maintained at a preset temperature.

J. Process Operation for High Temperature Chill Plate

Normally, after the substrate W is processed at a temperature of, for instance, 110° C., it is cooled down to room temperature (approximately 23° C.). However, when the substrate is to be cooled down to approximately 70° C., it is possible to do so by means of the hot plate oven 16. In other words, since the hot plate oven 16 of this embodiment is equipped with the auxiliary heating/cooling section 31, both a heating and a cooling process can be performed. It should be understood that since this cooling process is performed by using the Peltier effect element, there is a practical limitation in the cooling performance. However, as previously explained, when the temperature of the substrate is cooled down to temperatures around 70° C., it can be processed by the hot plate oven 16 having the auxiliary heating/cooling section 31.

K. Other Embodiments

The present invention is not limited to the above-described embodiments, but may be modified in a number of different ways.

Figure 12:
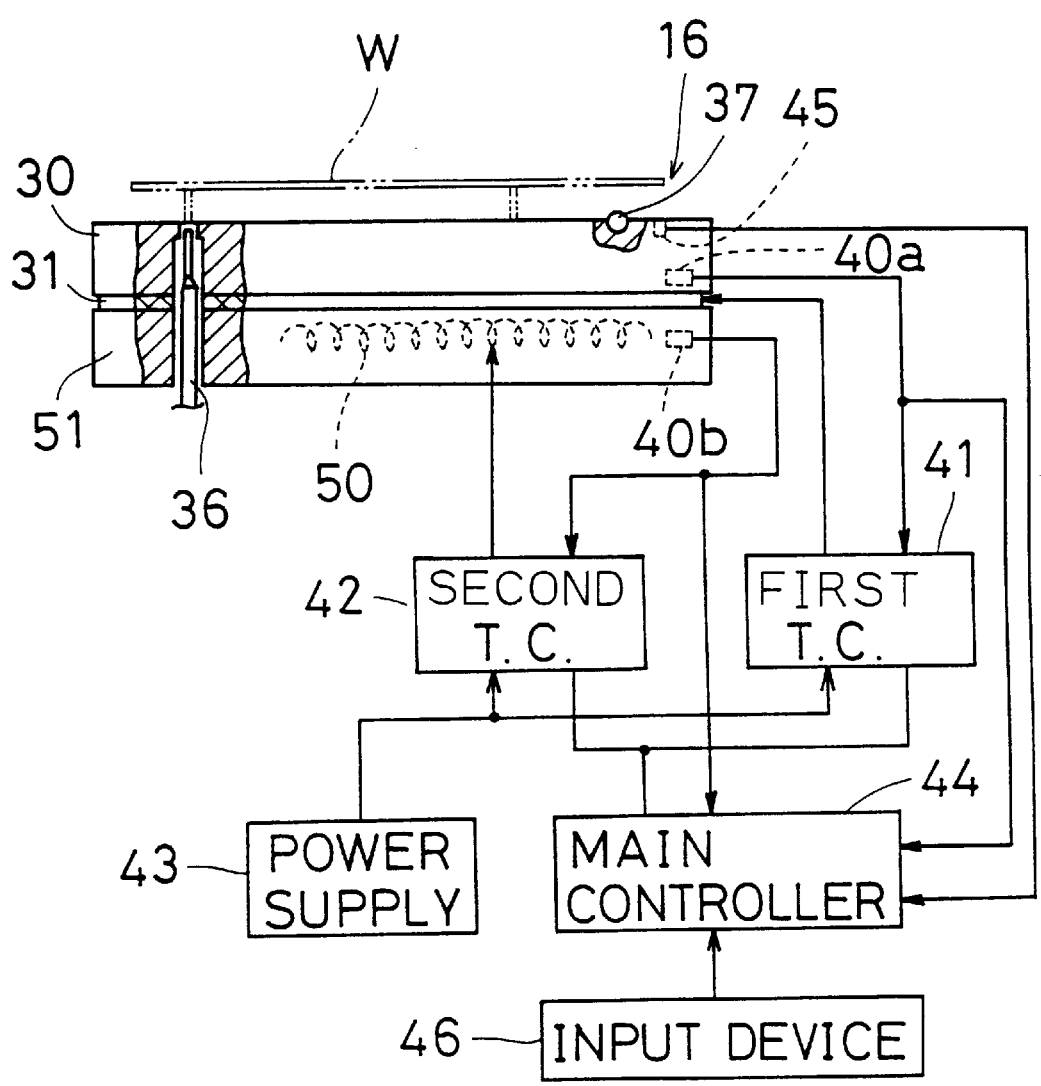
FIG. 12 is a diagram of a hot plate oven according to another embodiment of the present invention.

In the above-described embodiments, the main heating section 35 includes an intermediate plate 32, the heater section 33, and the heat radiation plate 34. However as shown in FIG. 12, the main heating section 35 may alternatively include a heater plate 51 into which a nichrome heater wire 50 is embedded. The heater wire 50 is embedded in an upper portion of the heater plate 51, and a heat radiation section is formed in a lower portion thereof.

The current supplied to the heater wire 50 is controlled by the second temperature controller 42. The structures of other portions are similar to those of the other embodiments described above. This embodiment allows the structure to be simplified, and the thickness of the hot plate oven 16 to be reduced.

Figure 13:
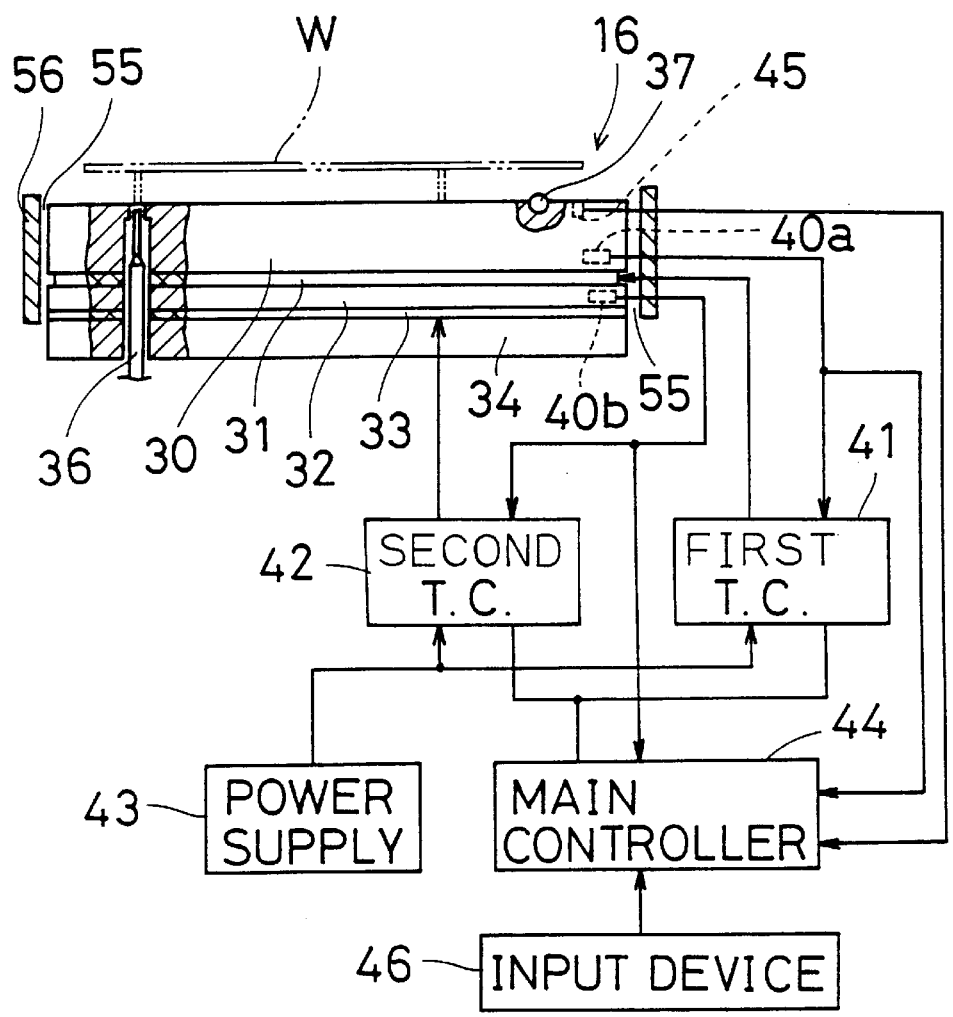
FIG. 13 is a diagram of a hot plate oven according to a yet another embodiment of the present invention.

In another embodiment shown in FIG. 13, a heat insulating material 56 may be arranged via an air gap (space) 55 around the substrate supporting plate 30.

The temperature of the outer peripheral portion of the substrate supporting plate 30 may be lower than the center portion thereof due to heat radiation. The insulating material 56 is arranged around the substrate supporting plate 30, the auxiliary heating/cooling section 31, the intermediate plate 32, and the heater section 33 (but not the heat radiation plate 34), so that heat radiation can be avoided, uniform temperature distribution can be achieved, and temperature increasing efficiency can be improved.

In addition, air gap 55 is provided between the heat radiating material 56 and the outer peripheral portion of the substrate supporting plate 30, because the thermal expansion coefficient of the substrate supporting plate 30 is different from that of the heat insulating member 56. This air gap 55 can prevent both the substrate supporting plate 30 and the heat radiating material 56 from being in contact with each other during thermal expansion.

Figure 14:
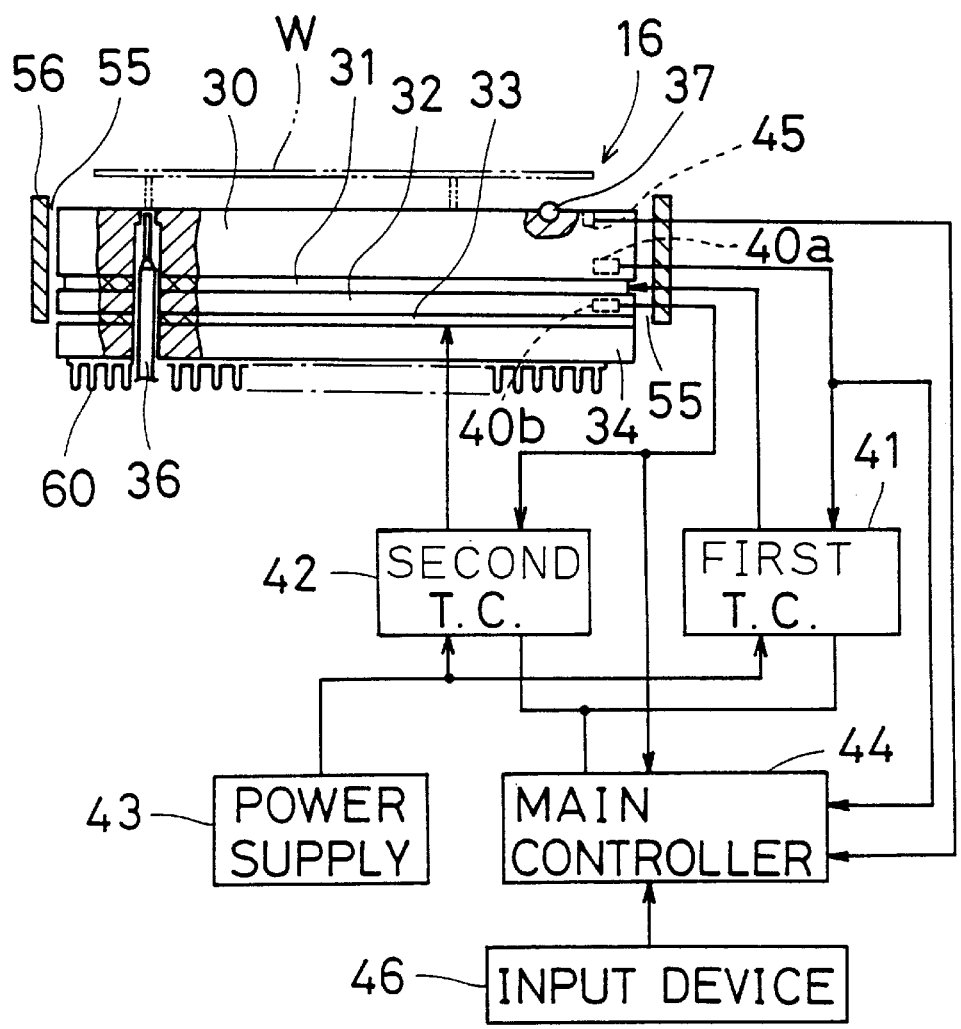
FIG. 14 is a diagram of a hot plate oven according to a yet another embodiment of the present invention.

In another embodiment shown in FIG. 14, the embodiment of FIG. 13 is modified by adding heat radiation fin 60 the lower surface of the heat radiation plate 34. This allows heat radiation efficiency and speed of cooling to be increased. In addition, the radiation fin 60 may be cooled by using a fan.

Figure 15:
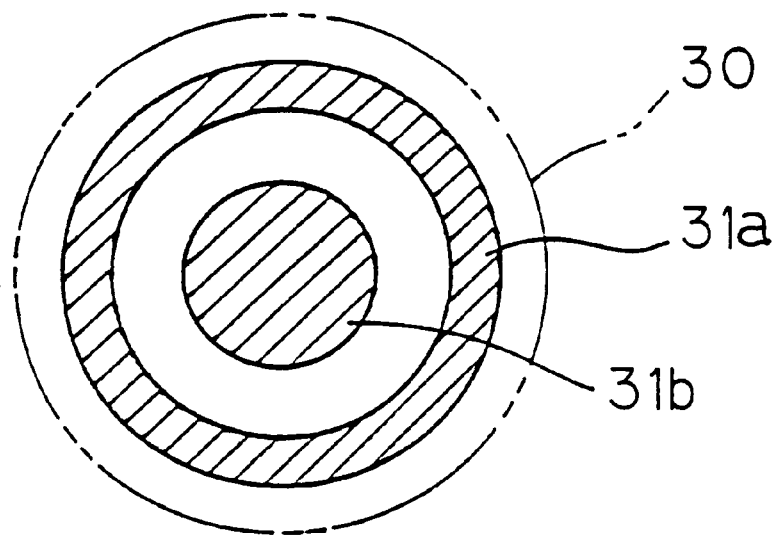
FIG. 15 is a plan view of an auxiliary heating/cooling section according to another embodiment of the present invention.
Figure 16:
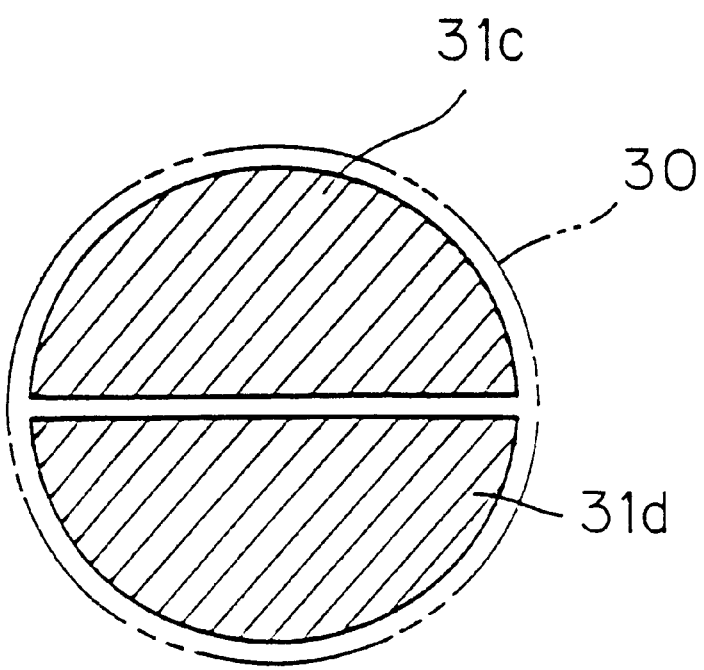
FIG. 16 is a plan view of an auxiliary heating/cooling section of yet another embodiment of the present invention.

In other embodiments shown in FIGS. 15 and FIG. 16, the auxiliary heating/cooling section 31 is subdivided into a plurality of regions controlled by separate temperature controllers.

In FIG. 15, the auxiliary heating/cooling section 31 is subdivided into a region 31a on the outer peripheral portion thereof, and another region 31b on the central portion thereof. Because the temperature of the outer peripheral portion can be lower than the central portion due to heat radiation, the electrical current supplied to the outer peripheral region 31a is higher than that supplied to the central region 31b. As a result, more uniform temperature distributions can be realized, as compared with an auxiliary heating/cooling section 31 having only one region.

As shown in FIG. 16, the auxiliary heating/cooling section 31 is subdivided into a region 31c located near the entrance of the substrate processing device, and another region 31d located at an inner position thereof. Because the temperature of region 31c may be lower, a higher electrical current is supplied to region 31c than to region 31d, so that more uniform temperature distributions can be achieved.

Alternatively, both the auxiliary heating/cooling section 31 and the heater section 33 may be subdivided respectively in a similar manner, and may be separately controlled.

It should be noted that hatched portions shown in FIG. 15 and FIG. 16 represent the regions of the auxiliary heating/cooling section 31, but the shape of the Peltier effect element is not formed so as to be fitted to these hatched portions.

Figure 17:
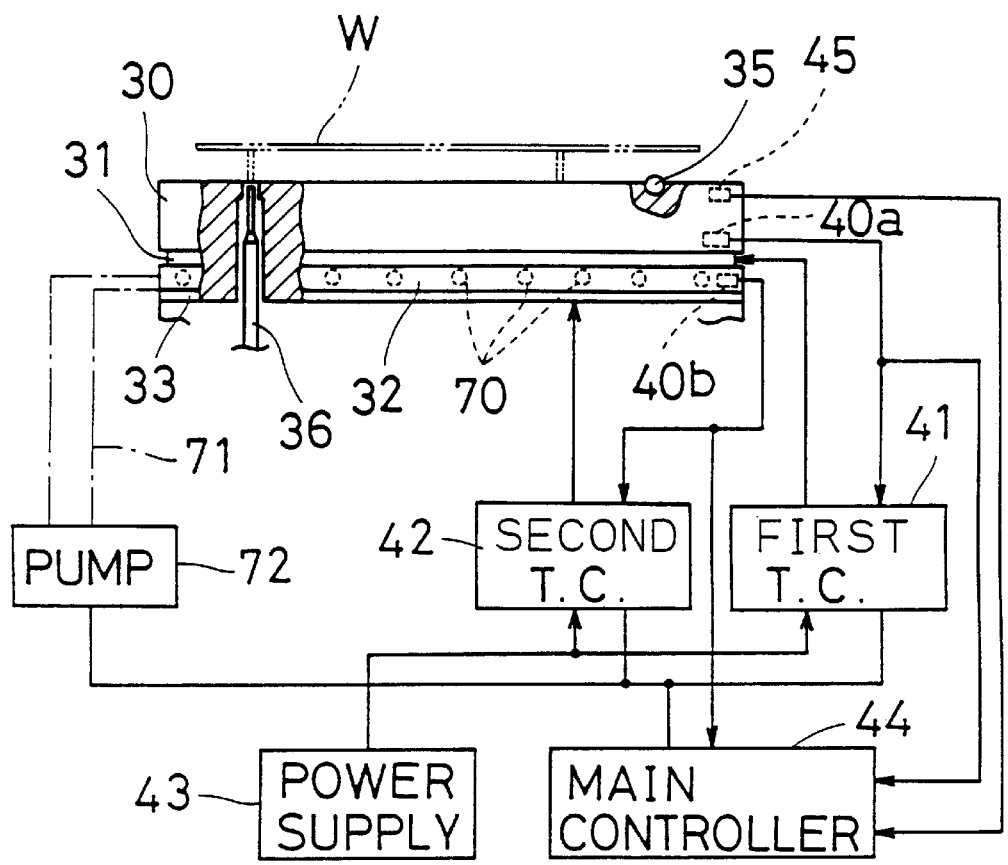
FIG. 17 is a diagram of a hot plate oven according to a yet another embodiment of the present invention.

In another embodiment, the hot plate oven 16 may have the structure shown in FIG. 17. As a result, the chill plate 15 may be omitted.

In the hot plate oven 16 shown in FIG. 17, cooling tubes 70 are provided inside the intermediate plate 32, and these cooling tubes 70 are connected via an external tube 71 to a pump 72. Cooling water is circulated via the pump 72 through these tubes 70 and 71, and the pump 72 is controlled by the main controller 44.

Figure 18:
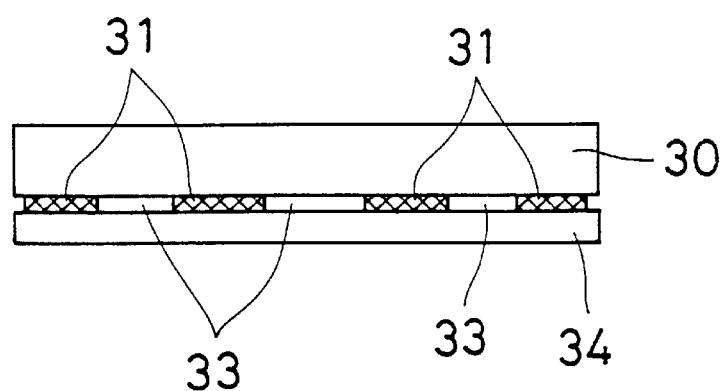
FIG. 18 is a side elevation of a hot plate oven according to a yet another embodiment of the present invention.

In another embodiment shown in FIG. 18, the auxiliary heating/cooling section 31 containing the Peltier effect element, and the heater section 33 constructed of the mica heater, etc. are arranged in parallel to each other between the substrate supporting plate 30 and the heat radiation plate 34. In such a structure, the thickness of the entire section along the vertical direction can be made thin.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A substrate processing device for heating and cooling a substrate, said device comprising:

a substrate supporting plate for supporting said substrate;

an auxiliary heating/cooling section constructed to perform heating and cooling operations for heating or cooling said substrate, said auxiliary heating/cooling section being disposed on a lower surface of said substrate supporting plate and including a Peltier effect element; and a main heating section being disposed below said substrate supporting plate and said auxiliary heating/cooling section, said main heating section for heating said substrate and including an intermediate plate in contact with a lower surface of said auxiliary heating/cooling section, a heater section in contact with a lower surface of said intermediate plate, and a heat radiation section in contact with a lower surface of said heater section.

2. A substrate processing device as claimed in claim 1 wherein:

said main heating section includes a heater plate with a heater wire embedded therein, said heater plate being in contact with a lower surface of said auxiliary heating/cooling section.

3. A substrate processing device as in claim 1, further comprising:

a heat insulating material disposed around at least said substrate supporting plate, said heat insulating material being separated from at least said substrate supporting plate by an air gap.

4. A substrate processing device as in claim 1 wherein:

a heat radiation fin is formed on a lower surface of said main heating section.

5. A substrate processing device as in claim 1 wherein:

said auxiliary heating/cooling section is divided into a plurality of regions, that are capable of independently heating and cooling said substrate.

6. A substrate processing device as in claim 1, further comprising:

a first temperature control section for controlling the heating and cooling operations of said auxiliary heating/cooling section; and a second temperature control section for controlling the heating operation of said main heating section.

7. A substrate processing device as in claim 1, further comprising:

a temperature detecting device for detecting temperature of said substrate supporting plate;

a substrate detecting device for detecting whether the substrate is mounted on said substrate supporting plate; and a control device for controlling said auxiliary heating/cooling section such that before a substrate is placed on said substrate supporting plate, the temperature of said substrate supporting plate is set lower than a desired predetermined temperature, and such that after a substrate is mounted on said substrate supporting plate, the temperature of said substrate supporting plate becomes said desired predetermined temperature.

8. A substrate processing device as in claim 1, wherein said auxiliary heating/cooling section further includes a heat source, said Peltier effect element and said heat source being disposed on said lower surface of said substrate supporting plate in parallel with each other.

9. A substrate processing device for heating and cooling a substrate, comprising:

a substrate supporting plate for supporting said substrate;

a heat exchanging device including a Peltier effect element, for heating and cooling said substrate supporting plate;

a temperature detecting device for detecting temperature of said substrate supporting plate;

a time measuring device for measuring an amount of time during which said substrate is supported by said substrate supporting plate; and a control device for controlling total amount of heat delivered to said substrate, said control device controlling said heat exchanging device in response to data derived from said temperature detecting device and said time measuring device.

10. A substrate processing device as in claim 9 wherein:

said control device controls a thermal progress on said substrate by controlling said heat exchanging device in a manner such that the temperature of said substrate supporting plate is raised above a first temperature to a predetermined temperature, said predetermined temperature is maintained for a predetermined amount of time, and said predetermined temperature is then lowered below a second temperature.

* * * * *